United States Patent
Park et al.

(10) Patent No.: US 8,248,871 B2
(45) Date of Patent: Aug. 21, 2012

(54) REDUNDANCY CIRCUITS AND SEMICONDUCTOR MEMORY DEVICES

(75) Inventors: Duk-Ha Park, Suwon-si (KR); Ki-Whan Song, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 290 days.

(21) Appl. No.: 12/662,644

(22) Filed: Apr. 27, 2010

(65) Prior Publication Data
US 2011/0013469 A1 Jan. 20, 2011

(30) Foreign Application Priority Data
Jul. 14, 2009 (KR) .......................... 10-2009-0063787

(51) Int. Cl.
*G11C 29/00* (2006.01)

(52) U.S. Cl. ...................... 365/200; 365/225.7; 365/203

(58) Field of Classification Search .................. 365/200, 365/225.7, 203
See application file for complete search history.

(56) References Cited

U.S. PATENT DOCUMENTS

| | | | |
|---|---|---|---|
| 6,044,028 A | * | 3/2000 | Tomohiro et al. ............. 365/200 |
| 2009/0285036 A1 | * | 11/2009 | Kobatake .................. 365/189.09 |
| 2010/0165775 A1 | * | 7/2010 | Obayashi et al. .......... 365/225.7 |

FOREIGN PATENT DOCUMENTS

| | | |
|---|---|---|
| KR | 10-0321166 | 1/2002 |
| KR | 10-0464944 | 12/2004 |
| KR | 10-0506978 | 8/2005 |

* cited by examiner

*Primary Examiner* — Huan Hoang
(74) *Attorney, Agent, or Firm* — Harness, Dickey & Pierce, P.L.C.

(57) ABSTRACT

A redundancy circuit includes at least one fuse set circuit and a fuse control circuit. The at least one fuse set circuit includes a plurality of fuse cells, each of the plurality of fuse cells having a first transistor and a second transistor having same sizes. The first transistor has a first contact resistance and the second transistor has a second contact resistance different from the first contact resistance. Each of the plurality of fuse cells stores a fuse address indicating a defective cell in a repair operation and outputs a repair address corresponding to the stored fuse address. The fuse control circuit, connected to the plurality of fuse cells, controls the plurality of fuse cells in response to a program signal and a precharge signal such that the corresponding fuse address is stored in each of the fuse cells.

18 Claims, 12 Drawing Sheets

REDUNDANCY CIRCUITS AND SEMICONDUCTOR MEMORY DEVICES

CROSS-REFERENCE TO RELATED APPLICATIONS

This application claims priority under 35 USC §119 to Korean Patent Application No. 10-2009-0063787, filed on Jul. 14, 2009 in the Korean Intellectual Property Office (KIPO), the entire contents of which are herein incorporated by reference.

BACKGROUND

1. Technical Field

Example embodiments relate to repairing, and more particularly to redundancy circuits, semiconductor memory devices including the same and methods of repairing a semiconductor memory device.

2. Description of the Related Art

As the integration degree of a semiconductor memory increases, a capacity of the semiconductor memory is increasing rapidly. Increasing of the capacity of the semiconductor memory according to the development of the semiconductor technology represents that the number of memory cell included in a chip increases. As the number of memory cell increases, the number of the defective memory cell also increases. Since an existence of a single defective memory cell causes a critical problem in the semiconductor memory device, redundant memory cells are provided against the defective memory cells. The defective memory cells are replaced with the redundant memory cells based on fuse information. When an address of the defective memory cell is inputted, a normal path is cut off and a redundancy path to the redundant cell is activated according to programmed/unprogrammed state of the fuse.

A laser fuse, as one of the widely used fuses, is programmed by cutting the fuse formed with a metal line using laser beam. The laser fuse has an advantage of being simply embodied since an additional circuit to control cutting of the fuse is unnecessary. The laser fuse, however, has disadvantages of limitation to the integration density regardless of the development of the semiconductor memory manufacturing process technology, such as a metal oxide semiconductor (MOS) process, since a predetermined interval between the fuses has to be secured to prevent damages due to laser fusing. Furthermore the laser fuse can not be reprogrammed after the memory chip including the fuse circuit is packaged. To overcome these disadvantages, an electrical fuse and an anti-fuse programmed by using an electrical signal have been proposed. These fuses have advantages that they can be reprogrammed even after the memory chip is packaged since they are activated or deactivated by the electrical signal. In addition, the size of the fuse circuit may be reduced as the scale of the manufacturing process is reduced. However, in the electrical fuse, residues remain around cutting area and thus the resistance of the program unit may not increase sufficiently. Such residues form an electrical path having a finite resistance. In the anti-fuse, electrical short may be incomplete and thus the resistance of the program unit may not decrease sufficiently. In these cases of incomplete programming, the change of the resistance of the program units is not sufficient and it is indefinite whether or not the program unit is programmed, thereby degrading the reliability of the fuse circuit.

The electrical fuse is programmed (i.e. cut) by applying a relatively high current through the electrical fuse in response to a control signal. The electrical fuse can be cut by externally applying the control signal even after the fuse circuit is packaged. The electrical fuse, however, requires a large size of a control driver for applying a high current through the electrical fuse and thus the size of the fuse circuit is relatively large.

The anti-fuse is programmed (i.e., electrically shorted) by applying a relatively high voltage to the anti-fuse in response to the control signal. Generally, the anti-fuse is embodied by a capacitor and both ends of the capacitor are electrically connected when dielectric material in the capacitor is damaged by the applied high voltage. The anti-fuse can be programmed by externally applying the control signal even after the fuse circuit is packaged. The reliability of the anti-fuse is determined according to a level of the applied voltage and thus the anti-fuse needs high voltage for increasing the reliability.

As such, the electrical fuse and the anti-fuse have advantages but they have a common disadvantage that the reliability of them is lower than the laser fuse since electrical characteristic of such fuses may be varied according to the change of manufacturing process. To increase the reliability of the electrical fuse and the anti-fuse, various methods are proposed but conventional methods can not guarantee the reliability of the fuses.

SUMMARY

Some example embodiments provide a redundancy circuit capable of reducing power consumption and occupying areas.

Some example embodiments provide a semiconductor memory device including the redundancy circuit.

According to example embodiments, a redundancy circuit includes at least one fuse set circuit and a fuse control circuit. The at least one fuse set circuit includes a plurality of fuse cells, each of the fuse cells having a first transistor and a second transistor having same sizes. The first transistor has a first contact resistance and the second transistor has a second contact resistance different from the first contact resistance. Each of the fuse cells stores a fuse address indicating a defective cell. The fuse control circuit controls the fuse cells in response to a program signal and a precharge signal such that the corresponding fuse address is stored in each of the fuse cells.

The fuse control circuit may include a control signal generating unit that generates a plurality of control signals in response to the program signal and the precharge signal and a fuse cell control unit that selectively connects a first power supply voltage and a second power supply voltage to the fuse cells in response to the control signals and operation modes, and the operation modes are based on the program signal and the precharge signal.

The level of the first power supply voltage may be lower that a level of the second power supply voltage, the first power supply voltage may be connected to the fuse cells when the program signal and the precharge signal indicate a precharge operation and a read operation of the operation modes, and the second power supply voltage is connected to the fuse cells when the program signal and the precharge signal indicate a program operation of the operation modes.

The fuse cell control unit programs fuse address into the second transistor in the program operation.

A threshold voltage of the second transistor may be higher than a threshold voltage of the first transistor when the fuse address is programmed into the second transistor.

The first and second electrodes of the second transistor may be respectively used as drain and source during the program operation, and the first and second electrodes of the second transistor may be used as source and drain, respectively, during the read operation.

The at least one fuse set circuit further may include a redundancy control unit that compares the repair address and an internal address corresponding an address of the defective cells to generate a redundancy enable signal.

The redundancy control unit may generate the redundancy enable signal at a first logic level if the repair address is the same as the internal address and at a second logic level if the repair address is different from the internal address.

The at least one fuse set circuit mat include a plurality of fuse set circuits.

The fuse control circuit may be connected to the plurality of fuse set circuits.

According to example embodiments, a semiconductor memory device includes a memory cell array, a redundancy circuit and an address decoder. The memory cell array includes a plurality normal memory cells and a plurality of redundancy memory cells. The redundancy circuit is programmed and outputs a redundancy enable signal when normal memory cells have at least one defective cell, the redundancy enable signal indicates whether redundancy circuit is programmed or not. The address decoder selectively accesses the normal memory cells and the redundant memory cells based on address signal and the redundancy enable signal. The redundancy circuit includes at least one fuse set circuit and a fuse control circuit. The at least one fuse set circuit includes a plurality of fuse cells, each of the fuse cells having a first transistor and a second transistor having same sizes. The first transistor has a first contact resistance and the second transistor has a second contact resistance different from the first contact resistance. Each of the fuse cells stores a fuse address indicating a defective cell in a repair operation and outputs a repair address corresponding to the stored fuse address. The fuse control circuit, commonly connected to the fuse cells, controls the fuse cells in response to a program signal and a precharge signal such that the corresponding fuse address is stored in each of the fuse cells.

The semiconductor memory device may further include an address buffer that outputs the fuse address in response to an external address designating the at least one defective cell, and output an internal address which is an address of the at least one defective cell.

The redundancy circuit may further include a redundancy control unit configured to compare the repair address and the internal address to generate the redundancy enable signal.

The memory cell array may include a plurality of banks, and the at least one fuse set circuit includes a row fuse set circuit for each row of the plurality of banks and a column fuse set circuit for each column of the plurality of banks.

The row fuse set circuits and the column fuse set circuits may be connected to the fuse control circuit.

The fuse control circuit includes a first fuse control circuit connected to the row fuse set circuits and a second fuse control circuit connected to the column fuse set circuits.

The fuse address may be programmed into the second transistor.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
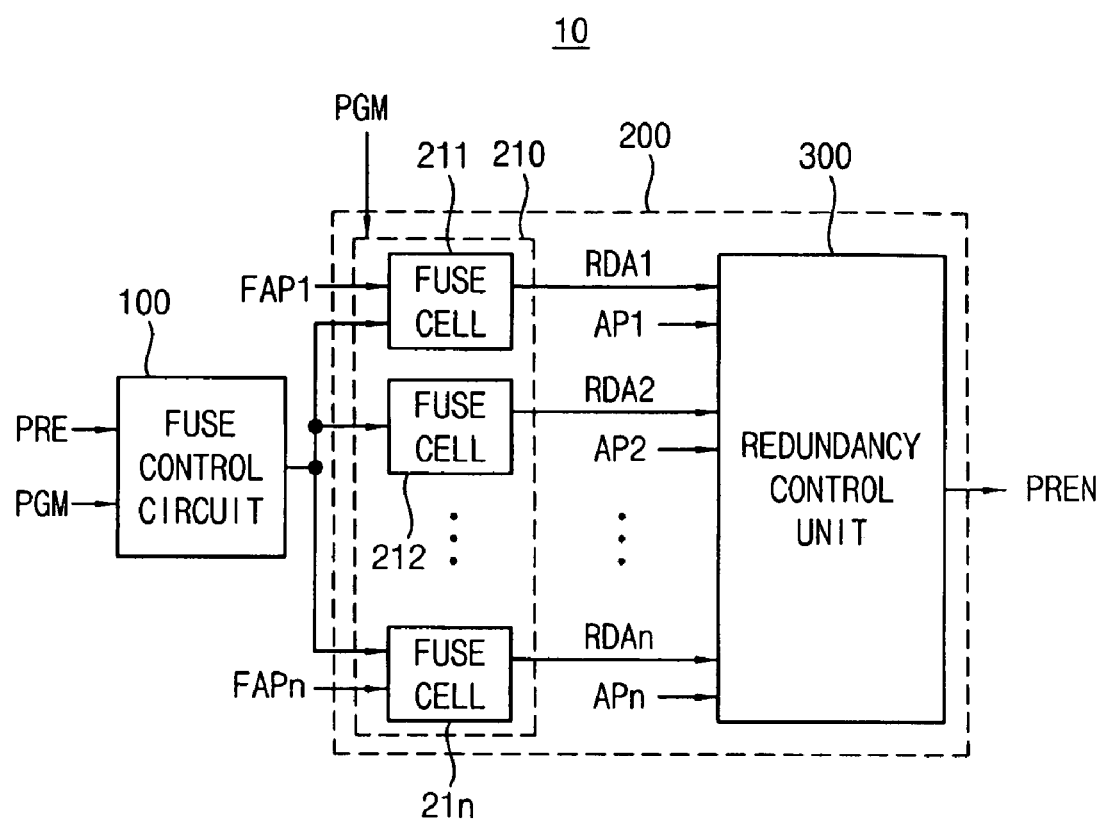
FIG. 1 is a block diagram illustrating an example of a redundancy circuit according to some example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an example of a redundancy circuit according to some example embodiments.

Referring to FIG. 1, a redundancy circuit 10 includes a fuse control circuit 100 and at least one fuse set circuit 200. The fuse set circuit 200 may include a fuse cell unit 210 and a redundancy control unit 300. The fuse cell unit 210 includes a plurality of fuse cells 211~21n.

The fuse control circuit 100 controls the plurality of fuse cells 211~21n in response to a precharge signal PRE and a program signal PGM. Each of the fuse cells 211~21n stores each of fuse addresses FAP1~FAPn (i.e., each of fuse addresses FAP1~FAPn is programmed into each of the fuse cells 211~21n), each indicating a defective cell under the control of the fuse control circuit 100, and outputs each of repair addresses RDA1~RDAn corresponding each of the stored fuse addresses FAP1~FAPn. The redundancy control unit 300 compares each of the repair addresses RDA1~RDAn and each of internal addresses AP1~APn to provide a redundancy enable signal PERN. Here, each of the internal addresses AP1~APn is an address of the defective cell. The defective cell may be substituted for a redundancy memory cell in response to the redundancy enable signal PREN.

Figure 2:
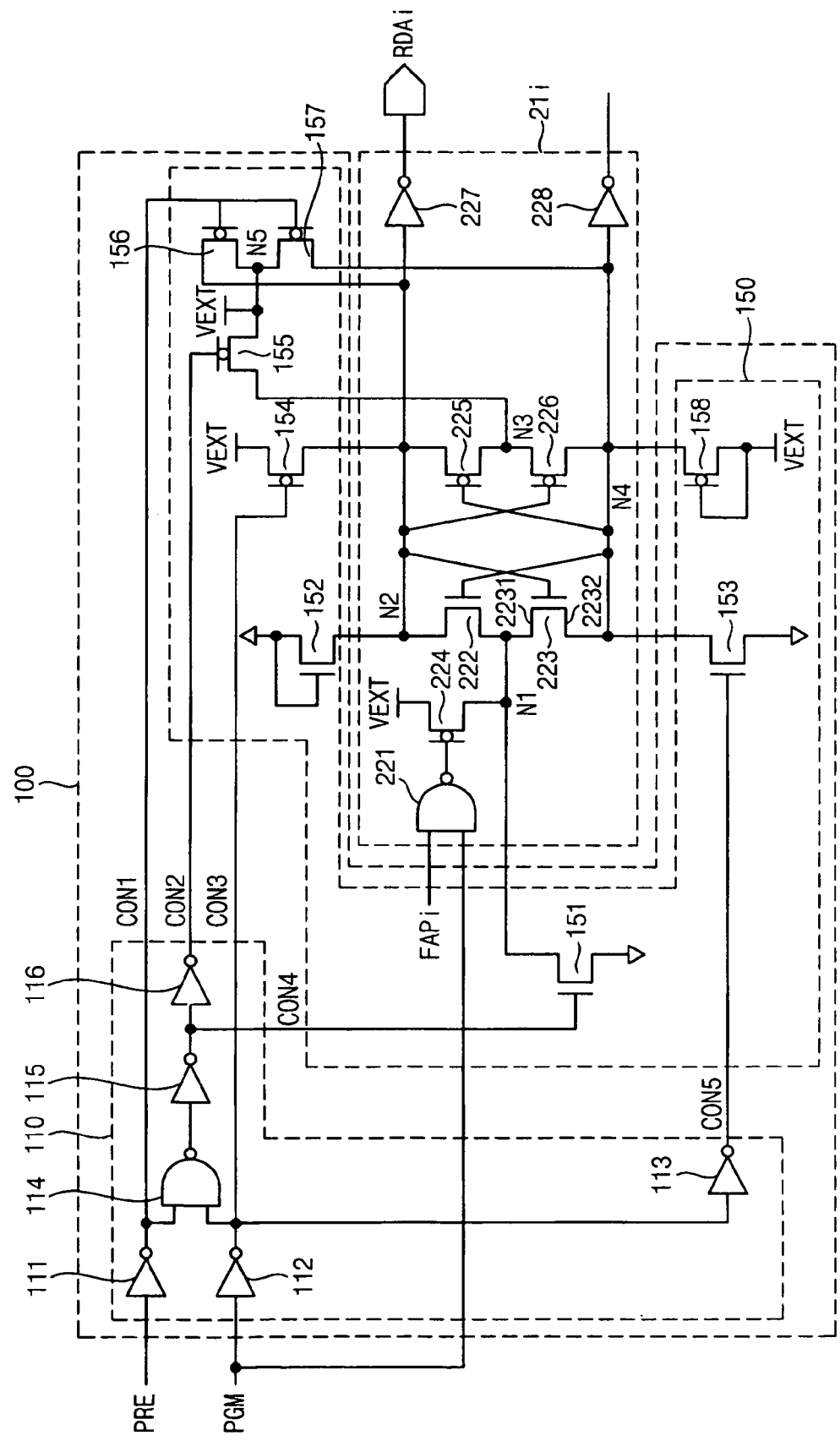
FIG. 2 is a circuit diagram illustrating a connection relationship between the fuse control circuit and one fuse cell in FIG. 1.

FIG. 2 is a circuit diagram illustrating a connection relationship between the fuse control circuit and one fuse cell in FIG. 1.

Referring to FIG. 2, the fuse control circuit 100 includes a control signal generating unit 110 and a fuse cell control unit 150.

The control signal generating unit 110 may includes a plurality of inverters 111, 112, 113, 115 and 116 and a NAND gate 114. The inverter 111 receives the precharge signal PRE and the inverter 112 receives the program signal PGM. The NAND gate 114 receives outputs of the inverters 111 and 112, and the inverter 113 receives output of the inverter 112. The inverter 113 receives output of the inverter 112. The output of the inverter 111 corresponds to a first control signal CON1, output of the inverter 116 corresponds to a second control signal CON2, the output of the inverter 112 corresponds to a third control signal CON3, the output of the inverter 115 corresponds to a fourth control signal CON4, and the output of the inverter 113 corresponds to a fifth control signal CON5. Logic level of the first control signal CON1 is determined based on the precharge signal PRE, logic levels of the third and fifth control signals CON3 and CON5 are determined based on the program signal PGM, and logic levels of the second and fourth control signals CON2 and CON4 are determined based on the precharge signal PRE and the program signal PGM.

The fuse cell control unit 150 includes n-channel metal oxide semiconductor (NMOS) transistors 151, 152 and 153 and p-channel metal oxide semiconductor (PMOS) transistors 154~158. The fuse cell 21i, representing one fuse cell of the fuse cells 211~21n, includes a NAND gate 221, NMOS transistors 222 and 223, PMOS transistors 224, 225, and 226 and inverters 227 and 228. The NMOS transistor 222 may correspond to a first transistor, and the NMOS transistor 223 may correspond to a second transistor.

The NAND gate 221 receives a fuse address FAPi, representing one of the fuse addresses FAP1~FAPn, and the program signal PGM. The program signal PGM is in a first logic level (i.e., logic high level) in a program operation, and the program signal PGM is in a second logic level (i.e., logic low level) in other operations such as a precharge operation and a read operation. The PMOS transistor 224 has a gate connected to the output of the NAND gate 221, a source connected to an external voltage VEXT and a drain connected to a first node N1. The NMOS transistor 151 has a gate receiving the fourth control signal CON4, a drain connected to the first node N1, and a source connected to a ground voltage. The NMOS transistor 222 has a source connected to the first node N1, a drain connected to a second node N2, and a gate connected to a fourth node N4. The NMOS transistor 223 has a first electrode 2231 connected to the first node N1, a second electrode 2232 connected to the fourth node N4 and a gate connected to the second node N2. The NMOS transistor 153 has a drain connected to the fourth node N4, a source connected to the ground voltage and a gate receiving the fifth control signal CON5.

The PMOS transistor 225 has a source connected to the second node N2, a drain connected to a third node N3, and a gate connected to the fourth node N4. The PMOS transistor 226 has a source connected to the third node N3 a drain connected to the fourth node N4, and a gate connected to the second node N2. The PMOS transistor 158 has a drain connected to the fourth node N4, and a gate and a drain connected to the external voltage VEXT. The NMOS transistor 152 has a drain connected to the second node N2, and a gate and a source connected to the ground voltage. The PMOS transistor 154 has a source connected to the external voltage VEXT, a gate receiving the third control signal CON3 and a drain connected to the second node N2. The PMOS 155 transistor has a gate receiving the second control signal CON2, a source connected to the external voltage VEXT and a drain connected to the third node N3. The PMOS transistor 157 has a gate receiving the first control signal CON1, a source connected to the external voltage VEXT and a drain connected to the fourth node N4. The inverter 227 inverts a signal at the second node N2 to provide a repair address RDA1 which represents one of the repair addresses RDA1~RDAn. Input of the inverter 228 is connected to the fourth node N4 and the drain of the PMOS transistor 157.

As described above, the fuse cell 21i includes the NMOS transistors 222 and 223 (i.e., the first and second transistors respectively). The sizes of the NMOS transistors 222 and 223 may be same, and the NMOS transistor 222 may have a first contact resistance and the NMOS transistor 223 may have a second contact resistance different from the first contact resistance when the NMOS transistor 222 has a smaller number of contacts than a number of contacts of the NMOS transistor 223. That is, the first contact resistance of the NMOS transistor 222 is greater than the second contact resistance of the NMOS transistor 223. Therefore, on current of the NMOS transistor 222 is smaller that on current of the NMOS transistor 223. Here, on current of a transistor is a current flowing through the transistor when the transistor is on state (i.e., the transistor is conducting).

Figure 3:
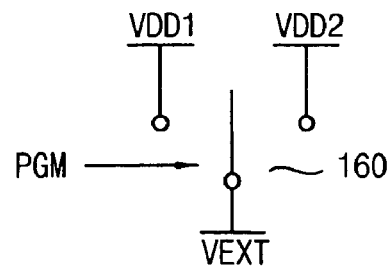
FIG. 3 illustrates a relationship of the program signal and various voltages.

FIG. 3 illustrates a relationship of the program signal and various voltages.

Referring to FIG. 3, the external voltage VEXT is selectively connected to a first power supply voltage VDD1 or a second power supply voltage VDD2 by a switch 160 responding to the program signal PGM. For example, when the program signal PGM is logic high level, the external voltage VEXT may be connected to the first power supply voltage VDD1, and when the program signal PGM is logic low level, the external voltage VEXT may be connected to the second power supply voltage VDD2. Level of the first power supply voltage VDD1 may be lower than a level of the second power supply voltage VDD2. The first power supply voltage VDD1 may be about 1.5 V and the second power supply voltage VDD2 may be about 4.0 V. Therefore, the external voltage VEXT may be about 4.0 V in the program operation, and the external voltage VEXT may be about 1.5 V in the precharge operation and the read operation.

Therefore, the control signal generating unit 110 generates the control signals CON1~CON5 in response to the precharge signal PRE and the program signal PGM, and the fuse cell control unit 150 may provide the first power supply voltage VDD1 or the second power supply voltage VDD2 according to operation modes including the precharge, program and read operations, based on the precharge signal PRE and the program signal PGM.

For example, when the precharge signal PRE is logic high level and the program signal PGM is logic high level, the operation mode may correspond to the precharge operation, and the first power supply voltage VDD1 may be connected to the external voltage VEXT in the precharge operation. When the precharge signal PRE is logic low level and the program signal PGM is logic high level, the operation mode may correspond to the program operation, and the second power supply voltage VDD2 may be connected to the external voltage VEXT in the program operation. When the precharge signal PRE is logic low level and the program signal PGM is logic low level, the operation mode may correspond to the read operation, and the first power supply voltage VDD1 may be connected to the external voltage VEXT again in the read operation.

Figure 5A:
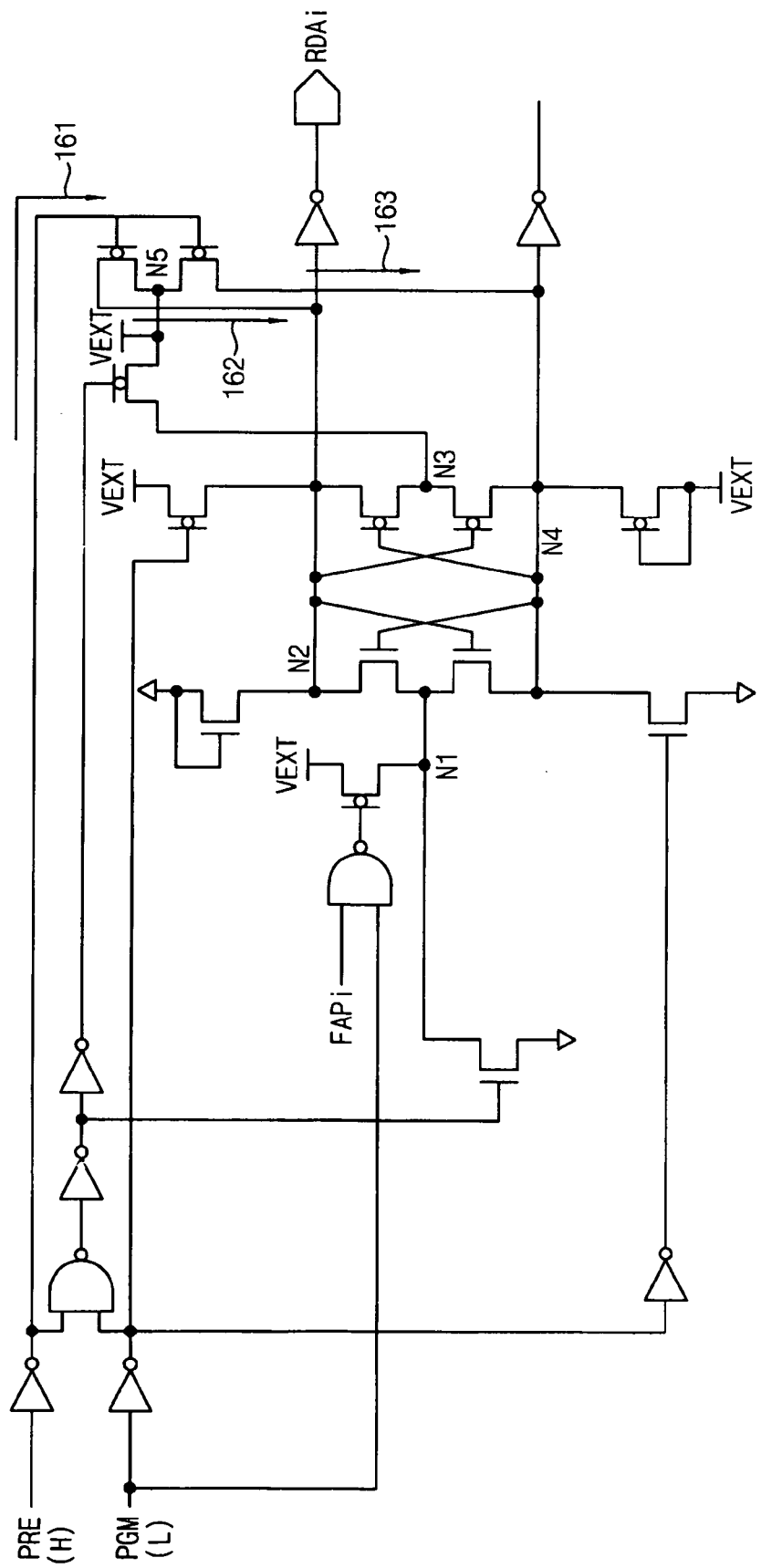
FIGS. 5A through 5C illustrates operation of the fuse cell according to the operation modes according to some example embodiments.
Figure 5B:
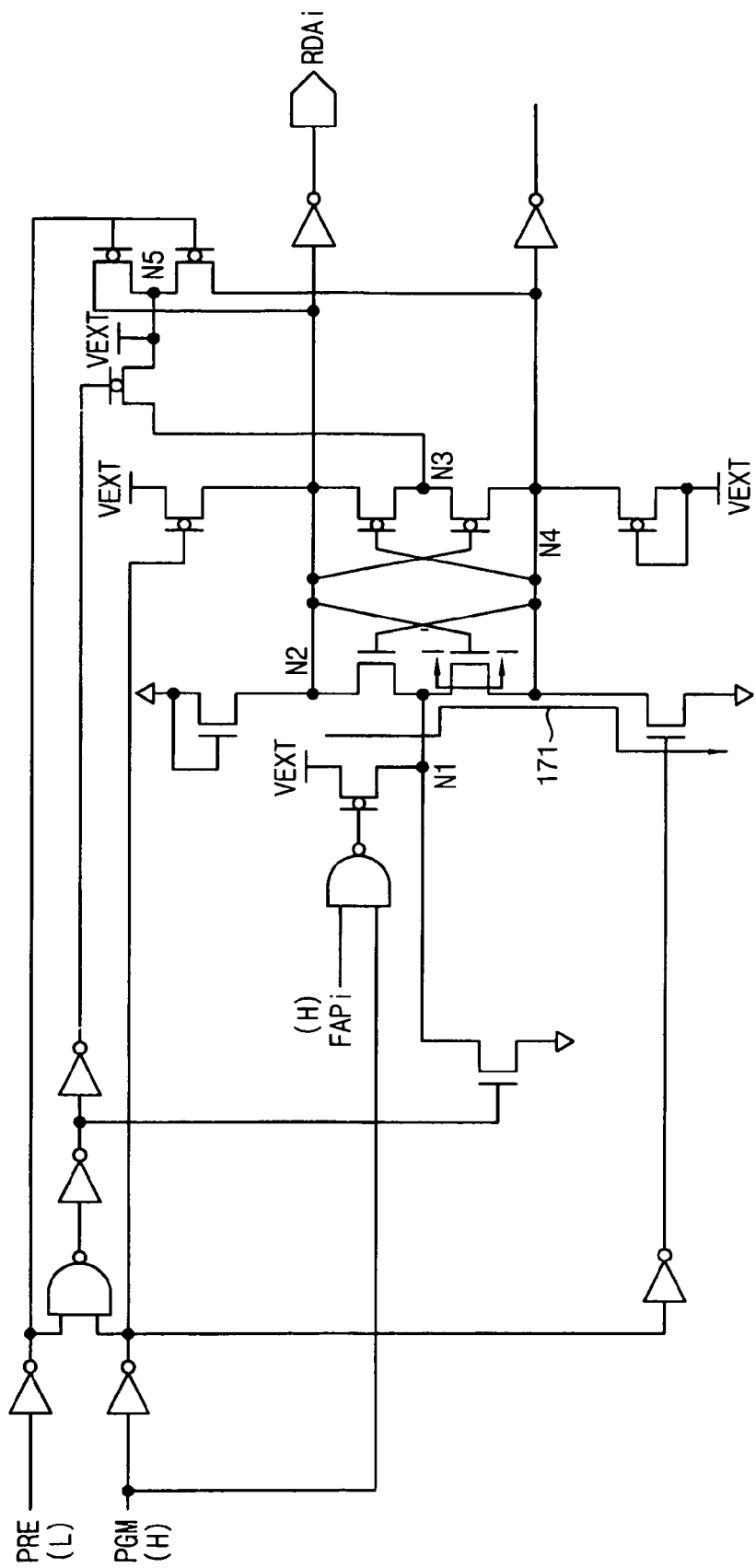
Figure 5C:
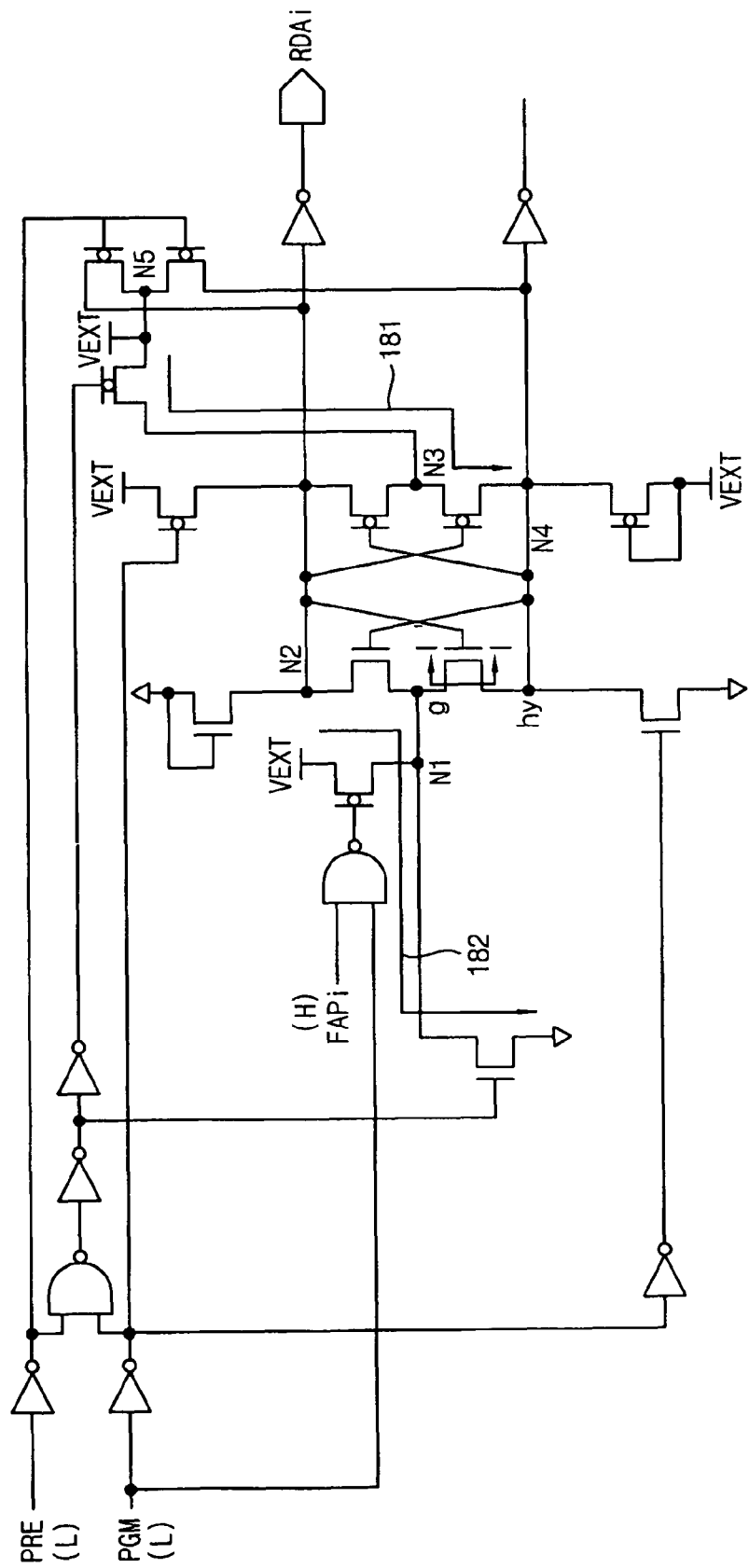

FIGS. 5A through 5C illustrates operation of the fuse cell according to the operation modes.

In FIGS. 5A through 5C, detailed reference numerals of elements included in the fuse control signal generating unit 110 and the fuse cell 211 for convenience of explanation.

FIG. 5A illustrates operation of the fuse cell in the precharge operation.

Referring to FIGS. 2, 3 and 5A, when the precharge signal PRE is logic high level and the program signal PGM is logic high level, the operation mode may correspond to the precharge operation as is described. Accordingly, a path 161 is logic low level, and thus the PMOS transistor 156 is turned on thereby to cause paths 162 and 163 to become logic high level. Therefore, the second and fourth node N2 and N4 are precharged to the level of the first power supply voltage VDD1, i.e., about 1.5V.

FIG. 5B illustrates operation of the fuse cell in the program operation.

Referring to FIGS. 2, 3 and 5B, as described above, when the precharge signal PRE is logic low level and the program signal PGM is logic high level, the operation mode may correspond to the program operation. The fuse address FAPi is also logic high level, and the output of the NAND gate 221 transitions to logic low level thereby to turn on the PMOS transistor 221. Accordingly, the first node N1 is pulled-up to the level of the second power supply voltage VDD2. In addition, the fourth control signal CON4 is logic low level thereby to turn off the NMOS transistor 151, and the fifth control signal CON4 is logic high level thereby to turn on the NMOS transistor 153. Therefore, current flows through a path 171 from the external voltage VEXT to the ground voltage thereby to pull-down the fourth node N4 to the ground voltage. In addition, the third control signal CON3 is logic low level thereby to turn on the PMOS transistor 154. Accordingly, the second node N2 is pulled-up the level of the second power supply voltage VDD2. Therefore, the second power supply voltage VDD2 is connected to the first electrode 2231 of the NMOS transistor 223 (i.e., the second transistor) and the ground voltage is connected to the second electrode 2232 of the NMOS transistor 223 in the program operation. That is, the first electrode 2231 of the NMOS transistor 223 (i.e., the second transistor) is used as a drain electrode and the second electrode 2232 of the NMOS transistor 223 is used as a source electrode in the program operation.

Figure 4A:
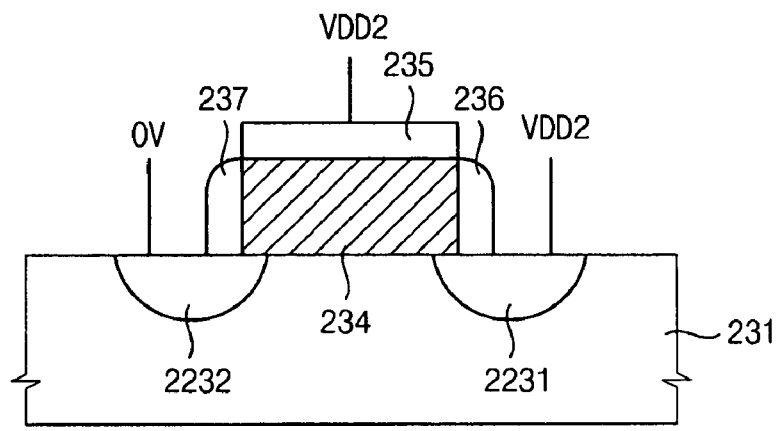
FIG. 4A is a cross-sectional diagram taken along a direction I-I' of a second transistor in FIG. 5B in the program operation.

FIG. 4A is a cross-sectional diagram taken along a direction I-I' of the second transistor in FIG. 5B in the program operation.

Referring to FIG. 4A, a p-type substrate 231, the first electrode 2231, the second electrode 2232, a gate electrode 234, a gate oxide layer 235 and side walls 236 and 237 are illustrated. As described above, the first electrode 2231 is used as a drain electrode and the second electrode 2232 is used as a source electrode, and thus hot electrons move from the second electrode 2232 to the first electrode 2231 in the program operation. Some of the hot electrons are trapped in the sidewall 236 in the program operation. When the program operation is over, the level of the threshold voltage of the NMOS transistor 223 (i.e., the second transistor) is higher than the level of the threshold voltage of the NMOS transistor 222 (i.e., the first transistor) due to the trapped hot electrons.

FIG. 5C illustrates operation of the fuse cell in the read operation.

Referring to FIGS. 2, 3 and 5C, as described above, when the precharge signal PRE is logic low level and the program signal PGM is logic low level, the operation mode may correspond to the read operation. The output of the NAND gate 221 transitions to logic high level thereby to turn off the PMOS transistor 221. The second control signal CON2 is logic low level thereby to turn on the PMOS transistor 155. Accordingly, the third node N3 transitions to the level of the first power supply voltage VDD1 to turn on the PMOS transistor 226. Therefore, current flows through a path 181 from the fifth node N5 to the fourth node N4 to pull-up the fourth node N4 to the level of the first power supply voltage VDD1. The NMOS transistor 222 is turned on because of the fourth node N4 is pulled-up to the level of the first power supply voltage VDD1. The NMOS transistor 223 is turned on with a time delay with respect to the NMOS transistor 222, because the level of the threshold voltage of the NMOS transistor 223 (i.e., the second transistor) is higher than the level of the threshold voltage of the NMOS transistor 222 (i.e., the first transistor) due to the trapped hot electrons in the program operation. In addition, since the fourth control signal CON4 is logic high level, the NMOS transistor 151 is turned on, and thus current sinks to the ground through a path 182 thereby to pull-down the second node N2 to the ground level. Since the second node N2 is ground level, the repair address RDAi is logic high level. Therefore, the ground voltage is connected to the first electrode 2231 of the NMOS transistor 223 (i.e., the second transistor) and the first power supply voltage VDD1 is connected to the second electrode 2232 of the NMOS transistor 223 in the read operation. That is, the first electrode 2231 of the NMOS transistor 223 (i.e., the second transistor) is used as a source electrode and the second electrode 2232 of the NMOS transistor 223 is used as a drain electrode in the read operation.

Figure 4B:
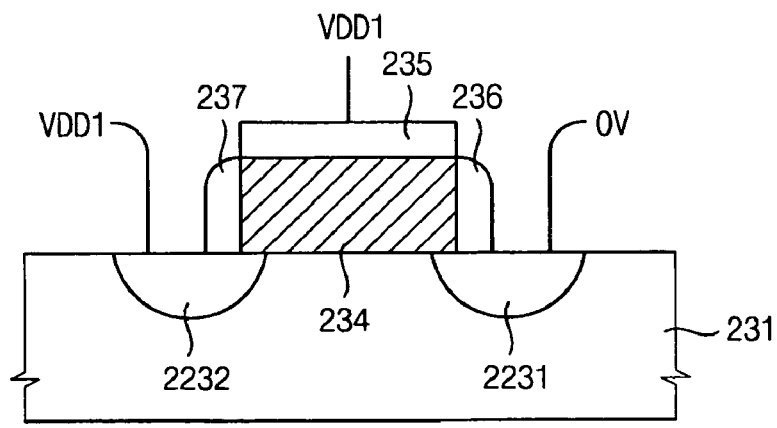
FIG. 4B is a cross-sectional diagram taken along a direction I-I' of a second transistor in FIG. 5C in the read operation.

FIG. 4B is a cross-sectional diagram taken along a direction I-I' of the second transistor in FIG. 5C in the read operation.

Referring to FIG. 4B, as described above, the first electrode 2231 is used as a source electrode and the second electrode 2232 is used as a drain electrode, and thus the trapped hot electrons impede channel formation between the first electrode 2231 and the second electrode 2232 thereby increase the level of the threshold voltage of the second transistor 223.

As described above, the first and second electrodes 2231 and 2232 of the NMOS transistor 223 are used as a drain electrode and a source electrode, respectively, in the program operation, and alternatively used as a source electrode and a drain electrode respectively in the read operation.

The NMOS transistor 152 and the PMOS transistor 153 are turned off to prevent a current path from being formed in the precharge, program and the read operations. In addition, the repair address RADi is a logic low level when the fuse address FAPi is not programmed in the NMOS transistor 223.

Figure 6A:
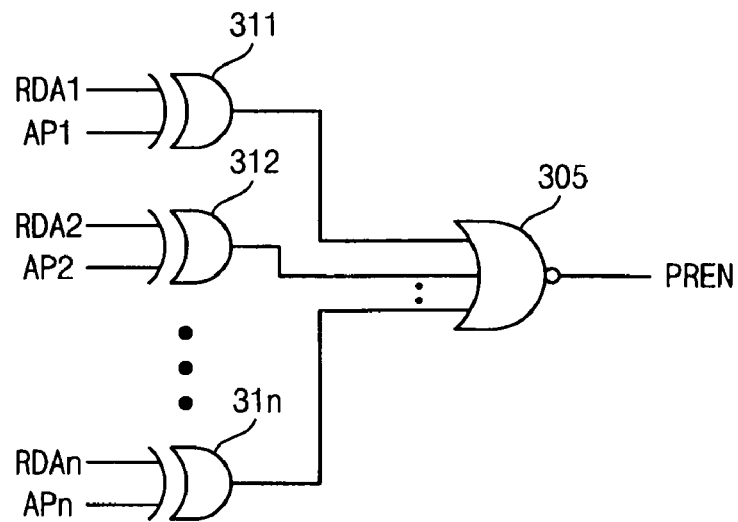
FIG. 6A is a circuit diagram illustrating an example of the redundancy control unit in FIG. 1 according to some example embodiments.

FIG. 6A is a circuit diagram illustrating an example of the redundancy control unit in FIG. 1 according to some example embodiments.

Referring to FIG. 6A, a redundancy control unit 310 includes a plurality of XOR gates 311~31n and a NOR gate 305. Each of the XOR gates 311~31n receives each of the repair addresses RDA1~RDAn and each of the internal addresses AP1~APn. Each of the XOR gates 311~31n determines whether each of the repair addresses RDA1~RDAn is same as each of the internal addresses AP1~APn or not. When each of the repair addresses RDA1~RDAn is identical with each of the internal addresses AP1~APn, each output of the XOR gates 311~31n is logic low level. When each output of the XOR gates 311~31n is logic low level, output of the NOR gate 305 corresponding to the redundancy enable signal PREN is logic high level. When redundancy enable signal PREN is logic high level, all memory cell corresponding to the internal addresses AP1~APn are defective cells, and thus the defective cells are replaced with redundancy memory cells by the unit of a column or a row. On the contrary, when at least one of the repair addresses RDA1~RDAn is not same as corresponding one of the internal addresses AP1~APn, the output of the NOR gate 305 corresponding to the redundancy enable signal PREN is logic low level. When redundancy enable signal PREN is logic low level, defective cells are not replaced with the redundancy memory cells.

Although the redundancy control unit 310 is implemented with the XOR gates 311~31n and the NOR gate 305 in an example embodiment of FIG. 6A, the redundancy control unit 310 may be implemented with the XOR gates 311~31n, a plurality of NOR gates receiving the outputs of the XOR gates 311~31n, and an AND gate receiving outputs of the NOR gates.

Figure 6B:
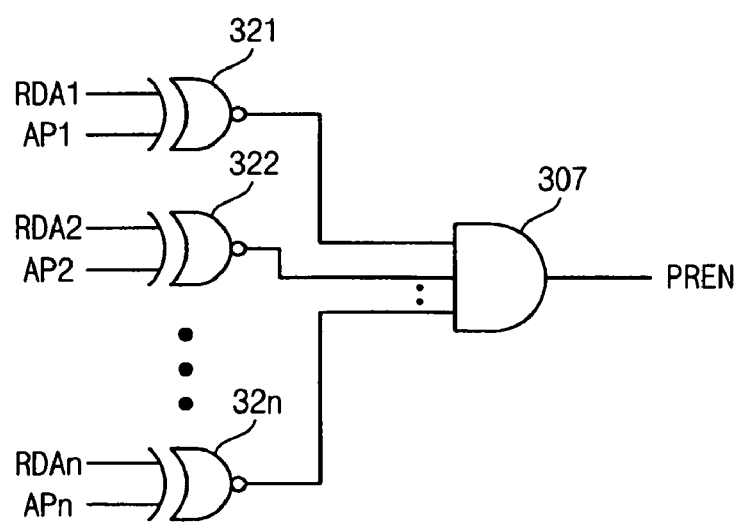
FIG. 6B is a circuit diagram illustrating an example of the redundancy control unit in FIG. 1 according to other example embodiments.

FIG. 6B is a circuit diagram illustrating an example of the redundancy control unit in FIG. 1 according to other example embodiments.

Referring to FIG. 6B, a redundancy control unit 320 includes a plurality of XNOR gates 321~32n and an AND gate 307. Each of the XNOR gates 321~32n receives each of the repair addresses RDA1~RDAn and each of the internal addresses AP1~APn. Each of the XNOR gates 321~32n determines whether each of the repair addresses RDA1~RDAn is same as each of the internal addresses AP1~APn or not. When each of the repair addresses RDA1~RDAn is identical with each of the internal addresses AP1~APn, each output of the XNOR gates 321~32n is logic high level. When each output of the XNOR gates 321~32n is logic high level, output of the AND gate 307 corresponding to the redundancy enable signal PREN is logic high level. When redundancy enable signal PREN is logic high level, all memory cells corresponding to the internal addresses AP1~APn are defective cells, and thus the defective cells are replaced with redundancy memory cells by the unit of a column or a row. On the contrary, when at least one of the repair addresses RDA1~RDAn is not same as corresponding one of the internal addresses AP1~APn, the output of the AND gate 307 corresponding to the redundancy enable signal PREN is logic low level. When redundancy enable signal PREN is logic low level, defective cells are not replaced with the redundancy memory cells.

Although the redundancy control unit 320 is implemented with the XNOR gates 321~32n and the AND gate 307 in an example embodiment of FIG. 6B, the redundancy control unit 320 may be implemented with the XNOR gates 321~32n, a plurality of AND gates receiving the outputs of the XNOR gates 321~321n, and additional AND gate receiving outputs of the AND gates.

Figure 7:
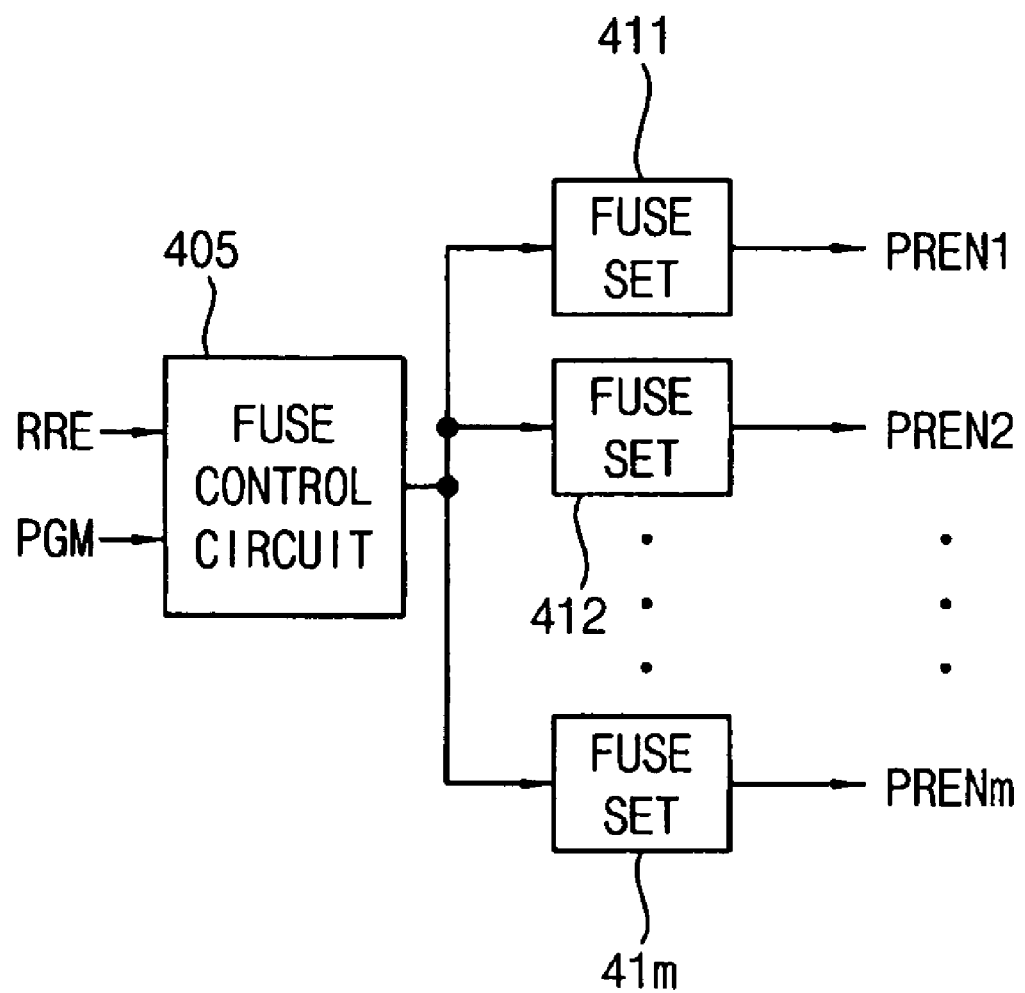
FIG. 7 is a block diagram illustrating an example of a redundancy circuit according to other example embodiments.

FIG. 7 is a block diagram illustrating an example of a redundancy circuit according to other example embodiments.

Referring to FIG. 7, a redundancy circuit 400 includes a fuse control circuit 405 and a plurality of fuse set circuits 411~41m. The fuse control circuit 405 controls the plurality of fuse set circuits 411~41m in response to a precharge signal PRE and a program signal PGM. The fuse control circuit 100 in FIG. 2 may be employed as the fuse control circuit 405, and the fuse set circuit 200 in FIG. 1 may be employed as each of the fuse set circuits 411~41m, and thus detailed descriptions of the fuse control circuit 405 and the plurality of fuse set circuits 411~41m will be omitted.

In an example embodiment of FIG. 7, the fuse control circuit 405 controls the plurality of fuse set circuits 411~41m, each of the fuse set circuits 411~41m output each of redundancy enable signals PREN1~PRENm, and each of redundancy enable signals PREN1~PRENm indicates whether each of the fuse set circuits 411~41m is programmed or not. In addition, each of the fuse set circuits 411~41m may include the plurality of fuse cells 211~21n and the redundancy control unit 300 as in FIG. 1. Each of the fuse set circuits 411~41m may be arranged with respect to a predetermined unit of the memory cell array. The predetermined unit may be a column or a low of a bank or a block of the memory cell array. Since one fuse control circuit 405 controls the plurality of fuse set circuits 411~41m, occupied area may be reduced and level of the operating voltage may be lowered.

Figure 8:
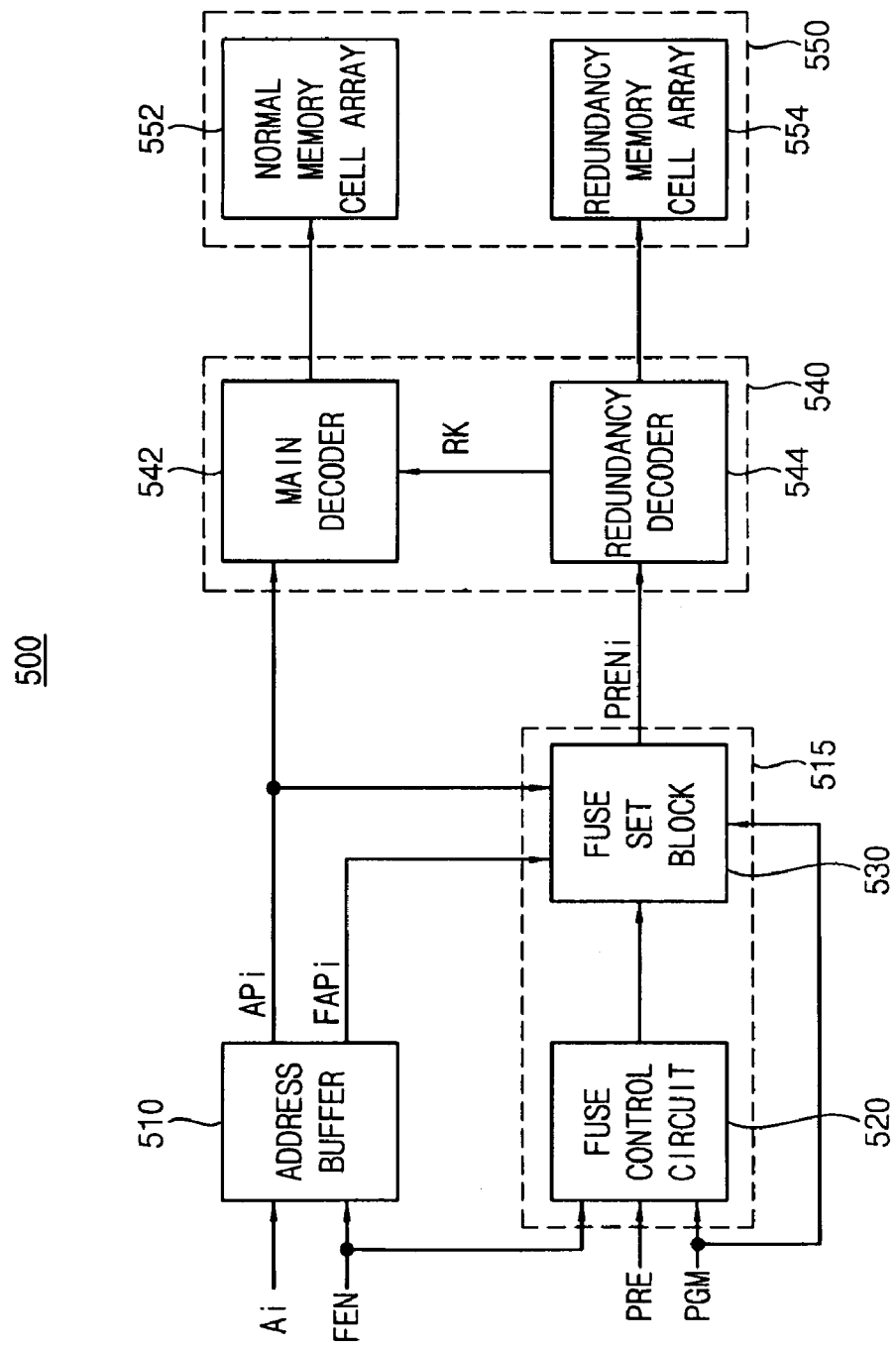
FIG. 8 is a block diagram illustrating a semiconductor memory device according to some example embodiments.

FIG. 8 is a block diagram illustrating a semiconductor memory device according to some example embodiments.

Referring to FIG. 8, a semiconductor memory device 500 includes an address buffer 510, a redundancy circuit 515, an address decoder 540 and a memory cell array 550. FIG. 8 illustrates circuits for explaining inventive concepts, and the semiconductor memory device 500 may further include an input/output buffer, a pre-decoder, peripheral circuits and other additional circuits which are not illustrated in FIG. 8. For example, the pre-decoder may include a main pre-decoder and a redundancy pre-decoder. The pre-decoder may be connected between the address buffer 510 and the address decoder 542, and may pre-decode an internal address APi and a redundancy enable signal PRENi.

The memory cell array 550 includes a normal memory cell array 552 and a redundancy memory cell array 554. The normal memory cell array 552 includes a plurality of normal memory cells and the redundancy memory cell array 554 includes a plurality of redundancy memory cells. The redundancy circuit 515 includes a fuse control circuit 520 and a fuse set block 530 which includes a plurality of fuse set circuits (Refer to FIG. 7). The fuse control circuit 100 in FIG. 2 may be employed as the fuse control circuit 520 and the plurality of fuse set circuits 411~41m in FIG. 7 may be employed in the fuse set block 530, and thus detailed description of the fuse control circuit 520 and the fuse set block 530 will be omitted. The redundancy circuit 515 is programmed when the normal memory cell array 522 has at least one defective cell, and provides the redundancy enable signal PRENi indicating whether the redundancy circuit 515 is programmed or not. The address decoder 540 includes a main decoder 542 and a redundancy decoder 544 and selectively accesses the normal memory cell array 552 and the redundancy memory cell array 554 based on the internal address APi and the redundancy enable signal PRENi.

Hereinafter, operation of the semiconductor memory device 500 will be described in detail with reference to FIG. 8.

When accessing a normal (normal memory cell array 552) cell, not a defective (normal memory cell array 552) cell, an external address Ai is input to the address buffer 510, the internal address APi as a buffered address from the address buffer 510 is decoded by the main decoder 542 so that a desired cell in the normal memory cell array 552 is accessed.

On the other hand, when a defective (normal memory cell array 552) cell is detected, a repair process is performed in which its address is programmed (stored) in the fuse cell included in the fuse set block 530 of the redundancy circuit 515 for repairing. When the defective (normal memory cell array 552) cell is repaired and then the same address as the stored defective address is input, the redundancy enable signal PRENi is activated thereby to enable the redundancy decoder 544. The enabled redundancy decoder 544 disables the main decoder 542 by a output signal RK such that a redundancy memory cell in the redundancy memory cell array 554 is substituted for the defective cell.

The redundancy circuit 515 is enabled by a fuse enable signal FEN, provided from an external test device, and performs the repair process on the defective cell in response to the precharge signal PRE and the program signal PGM. When the fuse enable signal FEN is input to the address buffer 510 for repairing a defective cell, the address buffer 510 generates fuse address FAPi to avoid affecting the normal operation of the semiconductor memory device 500. The fuse set block 530 in the redundancy circuit 515 programs the generated fuse address FAPi to generate the repair address RDAi.

Figure 9:
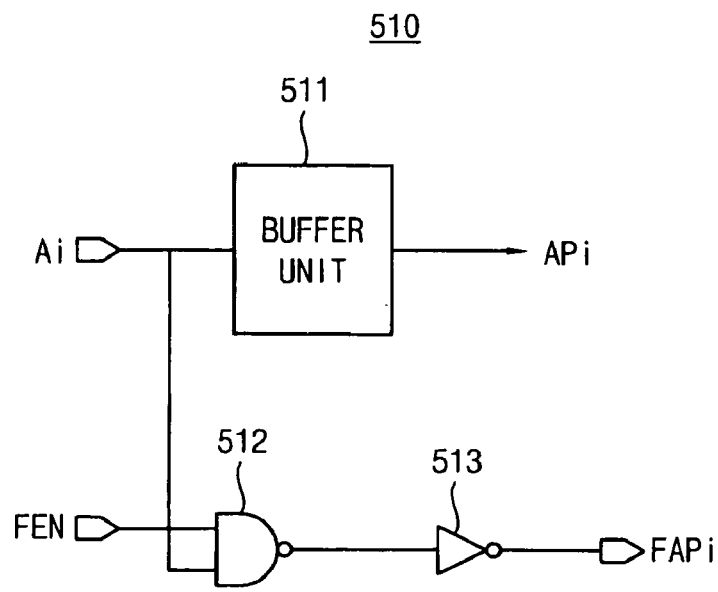
FIG. 9 is a block diagram illustrating an example of the address buffer in FIG. 8.

FIG. 9 is a block diagram illustrating an example of the address buffer in FIG. 8.

Referring to FIG. 9, the address buffer 510 includes a buffer unit 511, a NAND gate 512 and an inverter 513. The NAND gate 512 receives the external address Ai and the fuse enable signal FEN. An output of the NAND gate 512 is input to the inverter 513 to generate the fuse address FAPi based on the external address Ai. The buffer unit 511 for generating the internal address APi may be a conventional address buffer circuit.

In order to allow redundancy programming (repairing) operation without affecting the normal operation of the semiconductor memory device 500, the fuse address FAPi is used as an input address to the fuse set block 515 and the fuse address FAPi is programmed into the transistor of the fuse cell (Refer to FIG. 2). When the fuse enable signal FEN is low after the repair is completed and then the semiconductor memory device 500 operates, the redundancy circuit 515 does not affect the operation of the (repaired) device.

Figure 10:
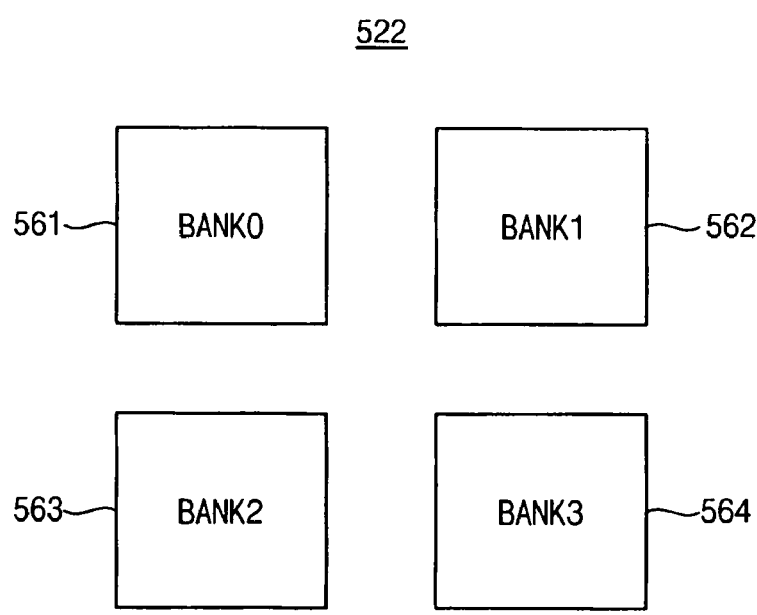
FIG. 10 is a block diagram illustrating an example of the normal memory cell array in FIG. 8.

FIG. 10 is a block diagram illustrating an example of the normal memory cell array in FIG. 8.

Referring to FIG. 8, the normal memory cell array 552 may include a plurality of banks 561, 562, 563 and 564. The number of the banks included in the normal memory cell array 552 may be various according to example embodiments.

Figure 11A:
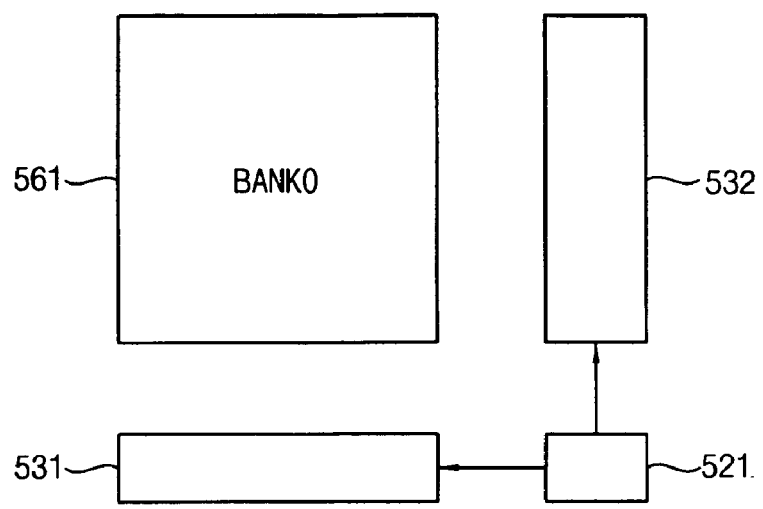
FIG. 11A is a block diagram illustrating one bank and the redundancy circuit according to some example embodiments.

FIG. 11A is a block diagram illustrating one bank and the redundancy circuit according to some example embodiments.

Referring to FIG. 11A, a row fuse set block 532, a column fuse set block 531 and a fuse control circuit 521 are arranged with respect to one bank 561. The row fuse set block 532 may include the same number of fuse set circuits (Refer to FIG. 7) as the rows of the bank 561. The column fuse set block 531 may include the same number of fuse set circuits (Refer to FIG. 7) as the columns of the bank 561. Each of the fuse set circuits in row fuse set block 532 and the column fuse set block 531 may include the fuse cell unit 210 and the redundancy control unit 300 as illustrated in FIG. 1. When the redundancy enable signal PRENi is activated, a corresponding row or corresponding column is substituted for the redundancy memory cells. In FIG. 11A, one fuse control circuit 521 controls the plurality of fuse set circuits corresponding to the sum of the columns of the bank 561 and the rows of the bank 561.

Figure 11B:
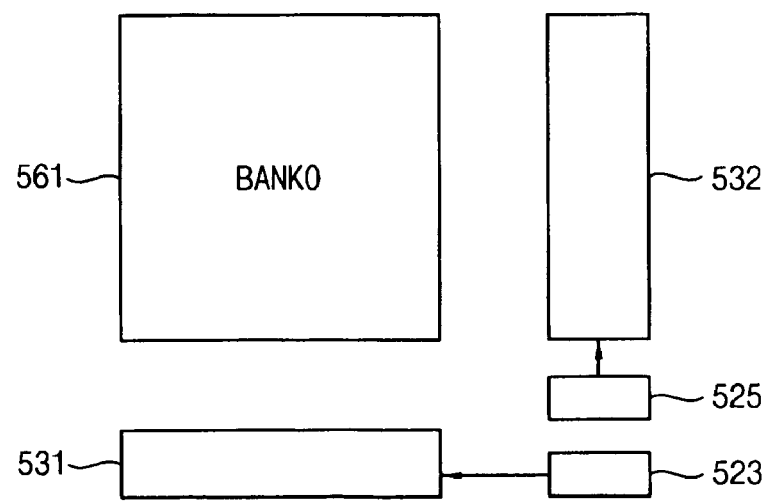
FIG. 11B is a block diagram illustrating one bank and the redundancy circuit according to other example embodiments.

FIG. 11B is a block diagram illustrating one bank and the redundancy circuit according to other example embodiments.

Referring to FIG. 11A, the row fuse set block 532, the column fuse set block 531 and fuse control circuits 523 and 524 are arranged with respect to one bank 561. The fuse control circuit 523 controls the column fuse set block 531, and the fuse control circuit 525 controls the row fuse set block 532. Each of the fuse set circuits in row fuse set block 532 and the column fuse set block 531 may include the fuse cell unit 210 and the redundancy control unit 300 as illustrated in FIG. 1. When the redundancy enable signal PRENi is activated, a corresponding row or corresponding column is substituted for the redundancy memory cells.

As illustrated in FIGS. 11A and 11B, since one or two fuse control circuits control the plurality of fuse set circuits, occupied area may be reduced and level of the operating voltage may be lowered according to example embodiments.

Figure 12:
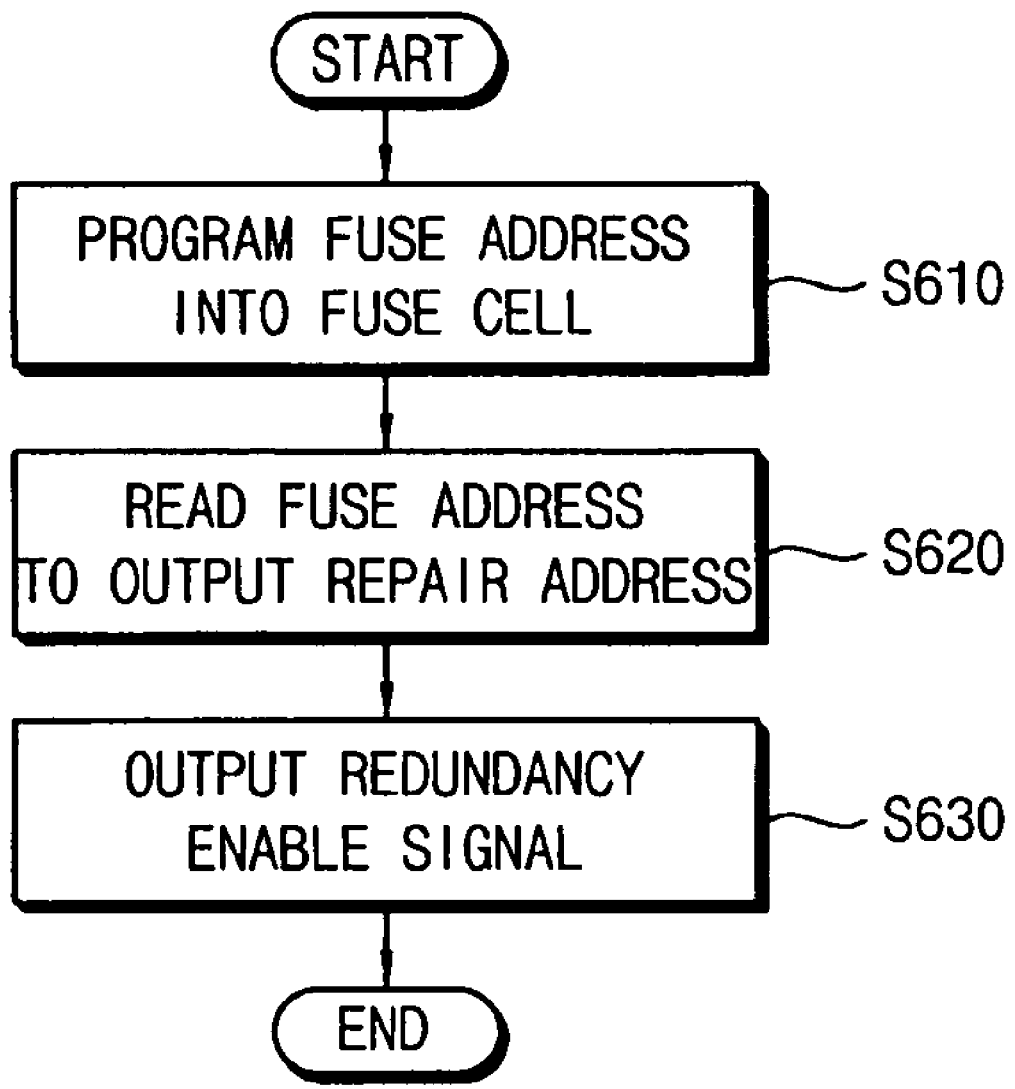
FIG. 12 is a flow chart illustrating a method of repairing a semiconductor memory device according to some example embodiments.

FIG. 12 is a flow chart illustrating a method of repairing a semiconductor memory device according to some example embodiments.

Hereinafter, there will be a detailed description about a method of repairing a semiconductor memory device with reference to FIGS. 1, 2 5A, 5B, 5C, 10 and 12.

In the method of repairing a semiconductor memory device 600, the fuse address FAPi indicating a detective cell is programmed into the fuse cells (211~21n) when the memory cells have defective cells (S610). Before the detective cell is programmed into the fuse cells 211~21n, during the test of the normal memory cell array 552 of the memory cell array 550, the semiconductor memory device 600 determines whether there is a fail and when the fail is detected, fail information for the normal memory cell (e.g., a failed cell address) is output, whether there is a row fail or a column fail based on the address specifying the defective (failed) cell, and whether to perform a row repair or column repair based on the check result.

When it is the row fail, the semiconductor memory device 600 determines whether the fail can be repaired. When the repairing is not possible, a "fail result" is output. When the row result is possible, an address is selected such that the address specifying the defective cell (a failed cell address) is used as the row address, and the fuse address to be used when repairing is used as a column address. The address buffer 510 outputs the fuse address FAPi under the control of the fuse enable signal FEN, and the fuse address FAPi is programmed into the fuse cells 211~21n in response to the prechagre signal PRE and the program signal PGM.

Stored fuse address FAPi is read, and the repair address RDAi is output (S620). Each of the repair RDAi address and each of the internal address APi are compared, and the redundancy enable signal PRENi is output (S630) based on the comparison result. When each of the repair RDAi address and each of the internal address APi are the same, the redundancy enable signal PRENi is activated and the row repair or the column repair is performed.

When the redundancy enable signal PRENi is activated, the main decoder 542 is disabled by the redundancy decoder 540, and the defective memory cells are substituted for the redundancy memory cells. In this case, the row repair or the column repair is performed on the defective memory cells based on the internal address APi.

As mentioned above, the fuse cell is programmed using non-volatile characteristic of the transistor, and one fuse control circuit controls a plurality of fuse cells. Accordingly, occupied area may be reduced, the repairing is possible in the package level in addition to the wafer level and the level of the operating voltage may be lowered. Therefore, example embodiments are employed in the various applications that need large memory capacity.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A redundancy circuit comprising:
   at least one fuse set circuit including a plurality of fuse cells, each of the plurality of fuse cells having a first transistor and a second transistor, the first transistor having a first contact resistance and the second transistor having a second contact resistance different from the first contact resistance, and each of the plurality of fuse cells configured to store a fuse address indicating a defective cell; and
   a fuse control circuit configured to control the plurality of fuse cells in response to a program signal and a precharge signal such that the corresponding fuse address is stored in each of the fuse cells.

2. The redundancy circuit of claim 1, wherein the first transistor and the second transistor have the same size.

3. The redundancy circuit of claim 1, wherein the fuse control circuit comprises:
   a control signal generating unit configured to generate a plurality of control signals in response to the program signal and the precharge signal; and
   a fuse cell control unit configured to selectively connect a first power supply voltage and a second power supply voltage to the plurality of fuse cells in response to the control signals and operation modes, the operation modes being based on the program signal and the precharge signal.

4. The redundancy circuit of claim 3, wherein a level of the first power supply voltage is lower than a level of the second power supply voltage, and the fuse cell control unit is configured to connect the first power supply voltage to the plurality of fuse cells if the program signal and the precharge signal indicate a precharge operation or a read operation of the operation modes, and the fuse cell control unit is configured to connect the second power supply voltage to the plurality of fuse cells if the program signal and the precharge signal indicate a program operation of the operation modes.

5. The redundancy circuit of claim 4, wherein the fuse cell control unit is configured to program fuse address into the second transistor in the program operation.

6. The redundancy circuit of claim 5, wherein a threshold voltage of the second transistor is higher than a threshold voltage of the first transistor if the fuse cell control unit programs the fuse address into the second transistor.

7. The redundancy circuit of claim 4, wherein first and second electrodes of the second transistor are configured to be a drain and a source, respectively, during the program operation, and the first and second electrodes of the second transistor are configured to be a source and a drain during the read operation, respectively.

8. The redundancy circuit of claim 1, wherein the at least one fuse set circuit further includes a redundancy control unit configured to compare a repair address and an internal address corresponding to an address of the defective cell to generate a redundancy enable signal.

9. The redundancy circuit of claim 8, wherein the redundancy control unit is configured to generate the redundancy enable signal at a first logic level if the repair address is the same as the internal address and at a second logic level if the repair address is different from the internal address.

10. The redundancy circuit of claim 1, wherein the at least one fuse set circuit includes a plurality of fuse set circuits.

11. The redundancy circuit of claim 10, wherein the fuse control circuit is connected to the plurality of fuse set circuits.

12. A semiconductor memory device comprising:
   a memory cell array including a plurality of first memory cells and a plurality of redundant memory cells;
   a redundancy circuit configured to output a redundancy enable signal if the plurality of first memory cells has at least one defective cell; and
   an address decoder configured to selectively access the plurality of first memory cells and the plurality of redundant memory cells based on an address signal and the redundancy enable signal,
   the redundancy circuit including,
     at least one fuse set circuit including a plurality of fuse cells, each of the plurality of fuse cells having a first transistor and a second transistor, the first transistor having a first contact resistance and the second transistor having a second contact resistance different from the first contact resistance, and each of the plurality of fuse cells configured to store a fuse address indicating the at least one defective cell; and
     a fuse control circuit configured to control the plurality of fuse cells in response to a program signal and a precharge signal such that the corresponding fuse address is stored in each of the fuse cells.

13. The semiconductor memory device of claim 12, wherein the first transistor and the second transistor are the same size.

14. The semiconductor memory device of claim 12, further comprising:
 an address buffer configured to output the fuse address in response to an external address designating the at least one defective cell, and output an internal address which is an address of the at least one defective cell.

15. The semiconductor memory device of claim 14, wherein the redundancy circuit further includes a redundancy control unit configured to compare a repair address and the internal address to generate the redundancy enable signal.

16. The semiconductor memory device of claim 12, wherein the memory cell array includes a plurality of banks, and the at least one fuse set circuit includes a row fuse set circuit for each row of the plurality of banks and a column fuse set circuit for each column of the plurality of banks.

17. The semiconductor memory device of claim 16, wherein the row fuse set circuits and the column fuse set circuits are connected to the fuse control circuit.

18. The semiconductor memory device of claim 16, wherein the fuse control circuit includes a first fuse control circuit connected to the row fuse set circuits and a second fuse control circuit connected to the column fuse set circuits.

* * * * *